United States Patent
Sakamoto

(10) Patent No.: US 9,905,708 B2
(45) Date of Patent: Feb. 27, 2018

(54) PANEL, PANEL MANUFACTURING METHOD, SOLAR CELL MODULE, PRINTING APPARATUS, AND PRINTING METHOD

(71) Applicant: Jun Sakamoto, Osaka (JP)

(72) Inventor: Koji Sakamoto, Osaka (JP)

(73) Assignee: Jun Sakamoto, Osaka (JP)

( * ) Notice: Subject to any disclaimer, the term of this patent is extended or adjusted under 35 U.S.C. 154(b) by 821 days.

(21) Appl. No.: 13/911,974

(22) Filed: Jun. 6, 2013

(65) Prior Publication Data

US 2013/0269749 A1 Oct. 17, 2013

Related U.S. Application Data

(63) Continuation of application No. PCT/JP2011/078054, filed on Dec. 5, 2011.

(30) Foreign Application Priority Data

Dec. 6, 2010 (JP) .................................. 2010-271473

(51) Int. Cl.
*H01L 31/0224* (2006.01)
*H01L 31/18* (2006.01)
(Continued)

(52) U.S. Cl.
CPC ...... *H01L 31/022425* (2013.01); *B41F 9/063* (2013.01); *B41F 13/008* (2013.01);
(Continued)

(58) Field of Classification Search
CPC ..... H01L 31/022466; H01L 31/022433; H01L 31/022483; H01L 31/022491; H01L 31/022475
See application file for complete search history.

(56) References Cited

U.S. PATENT DOCUMENTS 4,166,919 A 9/1979 Carlson
4,259,122 A * 3/1981 Purwin ............. H01L 31/02246
136/258

(Continued)

FOREIGN PATENT DOCUMENTS

JP 06-027482 A 2/1994
JP H06-27482 * 2/1994
(Continued)

OTHER PUBLICATIONS

An Office Action: "Notice of Reasons for Rejection," issued by the Japanese Patent Office on Jul. 2, 2013, which corresponds to JP2012-547843 and is related to U.S. Appl. No. 13/911,974.
(Continued)

*Primary Examiner* — Jayne Mershon
(74) *Attorney, Agent, or Firm* — Studebaker & Brackett PC

(57) ABSTRACT

A panel of the present invention includes a substrate, an electrode provided on the substrate, and a transparent conductive layer provided on the substrate along a side of the electrode. The electrode includes a contact region in contact with the transparent conductive layer and a non-contact region out of contact with the transparent conductive layer. Preferably, a part of the electrode is exposed through the transparent conductive layer. Preferably, the conductive layer is separated into one side and the other side of the electrode extending a predetermined direction.

11 Claims, 19 Drawing Sheets

(51) Int. Cl.
| | |
|---|---|
| *B41F 9/06* | (2006.01) |
| *B41F 13/008* | (2006.01) |
| *B41F 17/24* | (2006.01) |
| *H05K 3/12* | (2006.01) |
| *H05K 1/02* | (2006.01) |
| *H05K 1/09* | (2006.01) |
| *H05K 3/40* | (2006.01) |
| *B05C 1/08* | (2006.01) |

(52) U.S. Cl.
CPC ...... *B41F 17/24* (2013.01); *H01L 31/022466* (2013.01); *H01L 31/1884* (2013.01); *H05K 3/1241* (2013.01); *B05C 1/0813* (2013.01); *B05C 1/0817* (2013.01); *B41J 2202/04* (2013.01); *H05K 1/0289* (2013.01); *H05K 1/092* (2013.01); *H05K 3/4007* (2013.01); *H05K 2201/0108* (2013.01); *H05K 2201/0338* (2013.01); *H05K 2203/1476* (2013.01); *H05K 2203/1545* (2013.01); *Y02E 10/50* (2013.01)

(56) References Cited

U.S. PATENT DOCUMENTS

| | | | |
|---|---|---|---|
| 8,513,878 | B2 | 8/2013 | Tokunaga et al. |
| 2003/0121542 | A1 | 7/2003 | Harneit et al. |
| 2005/0150543 | A1* | 7/2005 | Nakashima ....... H01L 31/02242 136/256 |
| 2005/0241692 | A1* | 11/2005 | Rubin ............. H01L 31/022425 136/256 |
| 2007/0090403 | A1* | 4/2007 | Ahn .................... G02F 1/13458 257/211 |
| 2009/0295285 | A1 | 12/2009 | Tokunaga et al. |
| 2011/0209902 | A1* | 9/2011 | Tulloch .......... H01L 31/022425 174/254 |

FOREIGN PATENT DOCUMENTS

| | | | |
|---|---|---|---|
| JP | 2004-012631 A | | 1/2004 |
| JP | 2006-091691 | * | 4/2006 |
| JP | 2006-091691 A | | 4/2006 |
| JP | 2008-288102 A | | 11/2008 |
| JP | 2009-004348 A | | 1/2009 |
| JP | 2009-266559 A | | 11/2009 |
| WO | 2001/075976 A1 | | 10/2001 |
| WO | WO 2010017590 A1 * | | 2/2010 ..... H01L 31/022425 |

OTHER PUBLICATIONS

An Office Action: "Notice of Reasons for Rejection," issued by the Japanese Patent Office on Jul. 23, 2013, which corresponds to JP2013-101904 and is related to U.S. Appl. No. 13/911,974.
An Office Action: "Notice of Reasons for Rejection," issued by the Japanese Patent Office on Aug. 15, 2013, which corresponds to JP2013-101907 and is related to U.S. Appl. No. 13/911,974.
International Search Report; PCT/JP2011/078054.
The extended European search report issued by the European Patent Office dated Apr. 7, 2017, which corresponds to European Patent Application No. 11846108.6-1504 and is related to U.S. Appl. No. 13/911,974.

* cited by examiner

PANEL, PANEL MANUFACTURING METHOD, SOLAR CELL MODULE, PRINTING APPARATUS, AND PRINTING METHOD

CROSS REFERENCE TO RELATED APPLICATIONS

The present application is a continuation of International Application No. PCT/JP2011/078054, filed Dec. 5, 2011, which claims priority to Japanese Patent Application No. 2010-271473, filed Dec. 6, 2010. The contents of these applications are incorporated herein by reference in their entirety.

TECHNICAL FIELD

The present invention relates to panels, panel manufacturing methods, solar cell modules, printing apparatuses, and printing methods.

BACKGROUND ART

Solar panels can convert solar energy, which is clean and supplied inexhaustibly, to electric energy directly and is therefore expected as a new energy source. At the present time, a mainstream solar panel employs a silicon substrate, on the obverse surface of which a collector electrode is provided. It has been known that a transparent conductive layer is provided on the collector electrode to cover the collector electrode, thereby enhancing light extraction efficiency.

SUMMARY OF INVENTION

However, simple formation of the transparent conductive layer to cover the electrode may lead to an increase in cost.

The present invention has been made in view of the foregoing and has its object of providing a panel, a panel manufacturing method, a solar cell module, a printing apparatus, and a printing method, which can save on the cost.

A panel according to the present invention includes: a substrate; an electrode provide on the substrate; and a transparent conductive layer provided on the substrate along a side of the electrode. The electrode includes a contact region in contact with the transparent conductive layer and a non-contact region out of contact with the transparent conductive layer.

According to the panel of the present invention, the electrode includes not only the contact region in contact with the transparent conductive layer but also the non-contact region out of contact with the transparent conductive layer. This can reduce the use amount of a transparent conductive material, thereby saving on the cost.

In one embodiment, a part of the electrode is exposed through the transparent conductive layer.

In one embodiment, the electrode extends in a predetermined direction, and the transparent conductive layer is separated into one side and the other side of the electrode extending in the predetermined direction.

In one embodiment, the electrode includes a first electrode portion extending in the predetermined direction and a second electrode portion arranged at a different location from the first electrode portion and extending in parallel to the first electrode portion. The transparent conductive layer includes a first portion arranged along a side of the first electrode portion at a side of the second electrode portion and a second portion arranged along a side of the second electrode portion at a side of the first electrode portion. The first portion and the second portion are separated from each other.

In one embodiment, the electrode has a height from an obverse surface of the substrate, which is higher than the transparent conductive layer.

In one embodiment, the electrode has a height from the obverse surface of the substrate, which is lower than the transparent conductive layer.

In one embodiment, the electrode has a layered structure.

In one embodiment, the layered structure includes: a first conductive layer containing a first conductive material; and a second conductive layer containing a second conductive material different from the first conductive material.

A solar cell module according to the present invention includes a plurality of panels as described above.

A panel manufacturing method according to the present invention includes preparing a substrate; and forming an electrode and a transparent conductive layer on the substrate. In the forming, the electrode includes a contact region in contact with the transparent conductive layer and a non-contact region out of contact with the transparent conductive layer.

In one embodiment, the forming includes: printing ink containing a conductive material; printing ink containing a transparent conductive material; and baking the ink containing the conductive material and the ink containing the transparent conductive material.

In one embodiment, the printing ink containing a conductive material includes: printing ink containing a first conductive material; and printing ink containing a second conductive material different from the first conductive material.

A printing method according to the present invention includes: printing conductive ink containing a conductive material on a substrate; and printing transparent conductive ink containing a transparent conductive material on the substrate. The conductive ink includes a contact region in contact with the transparent conductive ink and a non-contact region out of contact with the transparent conductive ink.

In one embodiment, the printing conductive ink includes: printing ink containing a first conductive material; and printing ink containing a second conductive material different from the first conductive material.

A printing apparatus according to the present invention includes: a conveyor configured to convey a substrate having an obverse surface; and a printing section configured to print ink on the substrate conveyed by the conveyor. The printing section includes: a conductive ink printer configured to print conductive ink containing a conductive material on the substrate; and a transparent conductive ink printer configured to print transparent conductive ink containing a transparent conductive material on the substrate, and the conductive ink includes a contact region in contact with the transparent conducive ink and a non-contact region out of contact with the transparent conductive ink.

In one embodiment, the conductive ink printer includes: a printer configured to print ink containing a first conductive material; and a printer configured to print ink containing a second conductive material different from the first conductive material.

According to the present invention, the panel, the panel manufacturing method, the solar cell module, the printing apparatus, and the printing method can be provided which can save on the cost.

DESCRIPTION OF EMBODIMENTS

A panel, a panel manufacturing method, a solar cell module, a printing apparatus, and a printing method according to embodiments of the present invention will be described below with reference to the accompanying drawings. It is noted that although a solar panel is described as one example of a panel in the embodiments of the present invention, the present invention is not limited to the embodiments. In addition to the solar panel, the present invention is applicable to a touch panel, an organic EL panel, an electromagnetic field shield panel, etc.

Embodiment 1

Figure 1:
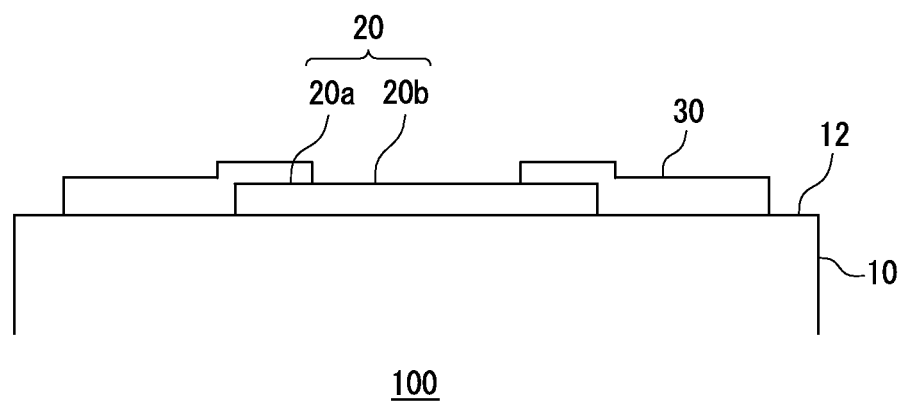
FIG. 1 is a schematic cross sectional view of a panel according to Embodiment 1 of the present invention.

A panel according to Embodiment 1 of the present invention will be described below with reference to the accompanying drawings. FIG. 1 is a schematic cross sectional view of a panel 100 according to the present embodiment. The panel 100 herein is a solar panel. FIG. 1 shows the vicinity of one of the principal surfaces of the panel 100 in an enlarged scale.

The panel 100 includes a substrate 10 and an electrode 20 provided on an obverse surface 12 of the substrate 10. It is noted that though not shown herein, the substrate 10 includes a photoelectric conversion layer. For example, the substrate 10 may be a silicon substrate and include a p-type silicon layer and a n-type silicon layer. Specifically, the photoelectric conversion layer may contain amorphous silicon or crystalline silicon. For example, the photoelectric conversion layer may contain single crystalline silicon, polycrystalline silicon, or microcrystalline silicon.

The electrode 20 may be made of, for example, a single substance or a mixture of silver, copper, gold, carbon, cobalt, titanium, nickel, aluminum, etc. Preferably, the electrode 20 is made of silver. Typically, the electrode 20 is made of metal and is opaque.

The panel 100 of the present embodiment further includes a transparent conductive layer 30 on the obverse surface 12 of the substrate 10. The transparent conductive layer 30 is arranged along each side of the electrode 20. The transparent conductive layer 30 is made of a material different from that of the electrode 20. Specifically, the transparent conductive layer 30 is made of a transparent conductive material. The transparent conductive layer 30 may be made of, for example, a single substance or a mixture of indium tin oxide (ITO), fluorine doped tin oxide (FTO), aluminum zinc oxide (AZO), or antimony tin oxide (ATO).

The electrode 20 includes, on its surface out of contact with the substrate 10, a contact region 20a in contact with the transparent conductive layer 30 and a non-contact region 20b out of contact with the transparent conductive layer 30. Here, a part of the electrode 20 is exposed through the transparent conductive layer 30. In the panel 100, carriers generated in the substrate 10 reach not only the electrode 20 but also the transparent conductive layer 30 to be efficiently extracted as electric current. Further, the transparent conductive layer 30 is in direct contact with the electrode 20, and the electrode 20 is partially covered with the transparent conductive layer 30. However, a part of the electrode 20 is not covered with the transparent conductive layer 30. This can save on a transparent conductive material, which is comparatively expensive.

Figure 2:
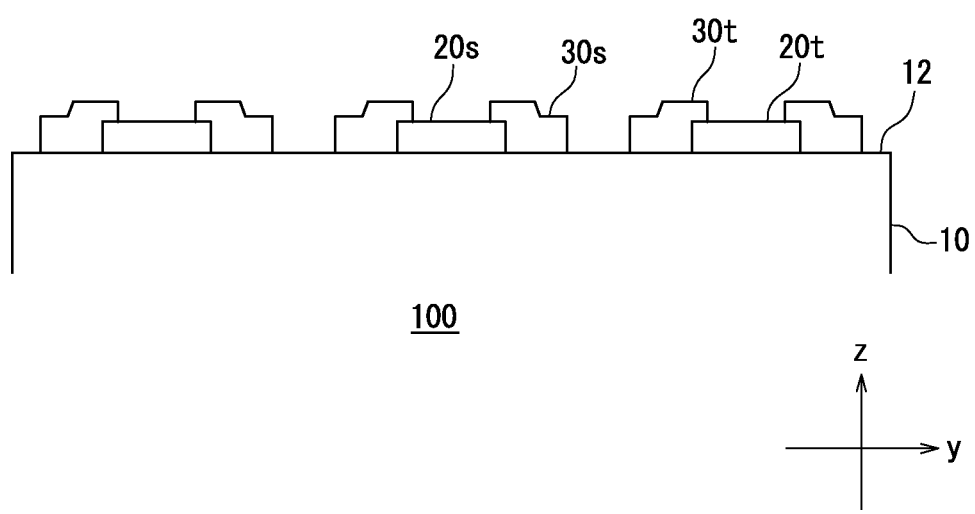
FIG. 2 is schematic cross sectional view of the panel according to Embodiment 1 of the present invention.

FIG. 2 is a schematic cross sectional view of the panel 100. The electrode 20 includes electrode portions extending in parallel to each other. In FIG. 2, the two electrode portions separated from and extending in parallel to each other are denoted as electrode portions 20s and 20t. It is noted that the electrode portions 20s, 20t may be electrically connected together at their other parts to have almost equal potential.

When assuming that the electrode portions 20s, 20t extend in the x direction orthogonal to the y direction and the z direction, for example, the transparent conductive layer 30 is separated into one side (on the side in the positive y direction) and the other side (on the side in the negative y direction) of each electrode portion 20s, 20t extending in the predetermined direction (the x direction). A part 30s of the transparent conductive layer 30, which is located at the side of the electrode portion 20s, and a part 30t of the transparent conductive layer 30, which is located at the side of the electrode portion 20t, are separated from each other. This can reduce the use amount of a transparent conductive material, which is comparatively expensive.

Figure 3:
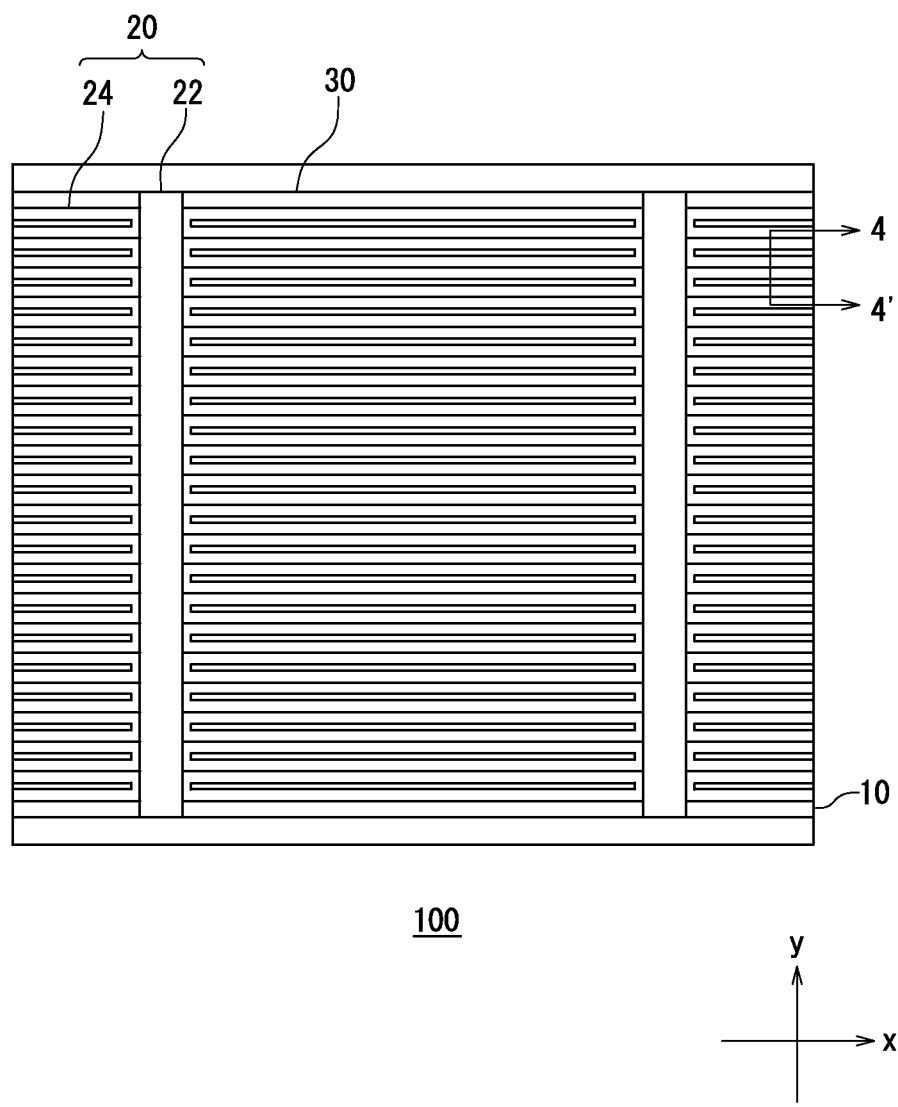
FIG. 3 is a tope view of the panel according to Embodiment 1 of the present invention.

One example of the panel 100 according to the present embodiment will now be described with reference to FIGS. 3 and 4. FIG. 3 is a schematic tope view of the panel 100. The electrode 20 includes bus bar electrodes 22 and finger electrodes 24 and may be called a collector electrode also. The finger electrodes 24 extend from each bus bar electrode 22. Typically, the finger electrodes 24 are arranged at given intervals. Herein, the bus bar electrodes 22 extend in the y direction, while the finger electrodes 24 extend in the x direction. In general, the bus bar electrodes 22 have a width wider than the finger electrodes 24.

Figure 4:
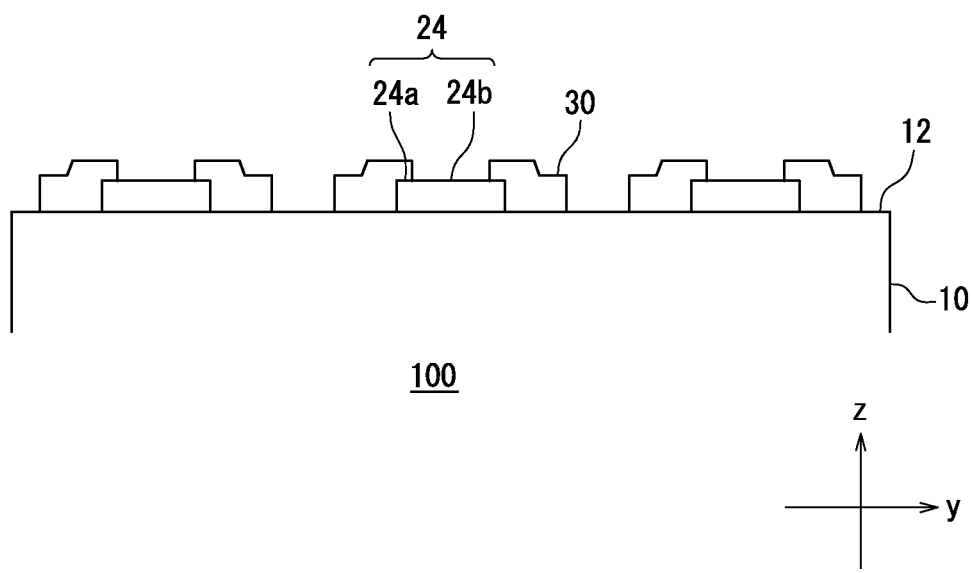
FIG. 4 is a schematic cross sectional view of the panel according to Embodiment 1 of the present invention.

FIG. 4 shows a cross section taken along the line 4-4' in FIG. 3. The transparent conductive layer 30 herein is arranged on the sides of each finger electrode 24. Each finger electrode 24 includes a contact region 24a in contact with the transparent conductive layer 30 and a non-contact region 24b out of contact with the transparent conductive layer 30. A part of each finger electrode 24 is exposed through the transparent conductive layer 30.

It is noted that the transparent conductive layer 30 located on the sides of each finger electrode 24 extends in the x direction likewise the finger electrode 24, as shown in FIG. 3. It is noted that the bus bar electrodes 22 herein are covered with the transparent conductive layer 30. The transparent conductive layer 30 continues in the vicinity of part where each bus bar electrode 22 intersects with the finger electrodes 24. For example, the panel 100 has a principal surface having a rectangular shape with length and width of 170 mm. Further, for example, the bus bar electrodes 22 have a width of 2 mm or larger and 3 mm or smaller, and the finger electrodes 24 have a width of 15 µm or larger and 70 µm or smaller. The pitch of the finger electrodes 24 (i.e., the distance between the center of one finger electrode 24 and the center of an adjacent finger electrode 24) is 2 mm. Provision of the transparent conductive layer 30 can increase the pitch of the finger electrodes 24 in the panel 100, for example, from 2 mm to 3 mm to reduce the number of the finger electrodes 24 from 85 to 56, which means reduction in about 30 finger electrodes 24. This can achieve cost reduction and an increase in area of openings.

Figure 5:
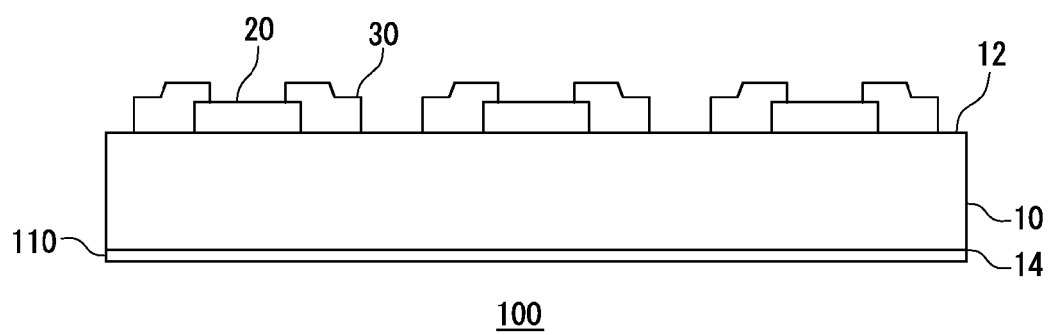
FIG. 5 is a schematic cross sectional view showing the entirety of the panel according to Embodiment 1 of the present invention.

FIG. 5 is a schematic illustration showing the entirety of the panel 100. The panel 100 includes an electrode 110 provided on the reverse surface 14 of the substrate 10 in addition to the electrode 20 provided on the obverse surface 12 of the substrate 10. Typically, the electrode 110 is provided so as to cover the entirety of the reverse surface 14 of the substrate 10. For example, the electrode 110 is made of aluminum.

With reference to FIG. 6, a method for suitably manufacturing the panel 100 will be described below. First, as shown in FIG. 6A, the substrate 10 having the obverse surface 12 is prepared. As described above, the substrate 10 may be a silicon substrate, for example. Next, as shown in FIG. 6B, ink K1 is printed on the obverse surface 12 of the substrate 10. Specifically, the ink K1 containing a conductive material D1 is printed on the substrate 10. For example, the ink K1 includes the conductive material D1 in particulate form and a vehicle. The vehicle contains resin and a solvent. The ink K1 has appropriate thixotropy.

The conductive material D1 may be a single substance or a mixture of silver, copper, gold, carbon, cobalt, titanium, nickel, aluminum, etc. Further, the resin may be called binder resin. As the binder resin, generally called inorganic resin, such as acrylic based paste, urethane based paste, etc. may be used. Further, examples of the solvent may include terpineol, toluene, xylene, or a mixed solvent thereof (e.g., a solvent thereof with which polypropylene, glycol, methylene, ether, or acetate is mixed). It is noted that the firing temperatures (boiling point) of solvents are lower than that of binder resin in general. For example, the boiling point of terpineol is about 230° C. or lower. The boiling point of PGMA is about 140° C. While on the other hand, the firing temperature of the binder is about 250° C.

Figure 6A:
FIGS. 6A-6D are schematic illustrations for explaining a panel manufacturing method according to Embodiment 1 of the present invention.
Figure 6B:
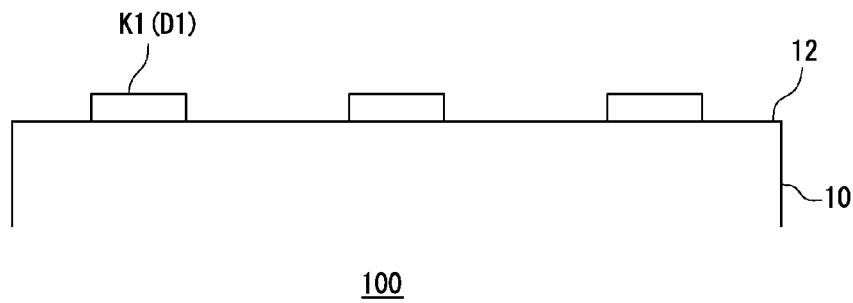
Figure 6C:
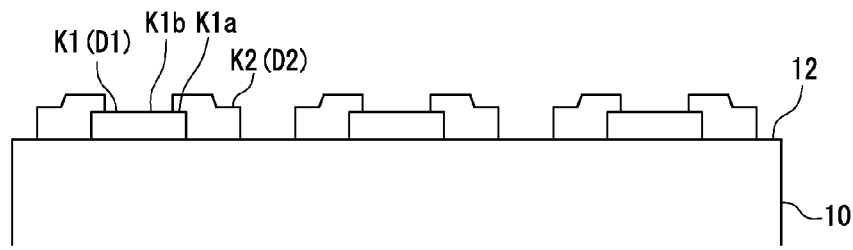

Subsequently, as shown in FIG. 6C, ink K2 containing a transparent conductive material D2 is printed so as to be in contact with the ink K1. As described above, the transparent conductive material D2 is a material different from the conductive material D1. The transparent conductive material D2 may be a single substance or a mixture of indium tin oxide (ITO), fluorine doped tin oxide (FTO), aluminum zinc oxide (AZO), or antimony tin oxide (ATO).

For example, the ink K2 includes the transparent conductive material D2 in particulate form and a vehicle. The vehicle contains resin and a solvent. The vehicle of the ink K2 may be the same as that of the ink K1. Or, the vehicle of the ink K2 may be similar to that of the ink K1.

It is noted that the ink K1 includes, on its surface out of contact with the substrate 10, a contact region K1a in contact with the ink K2 and a non-contact region K1b out of contact with the ink K2. Here, a part of the ink K1 is exposed through the ink K2. The ink K2 is in direct contact with the ink K1, but exposes the part of the ink K1. It is noted that the ink K1 and the ink K2 may be referred to as a first ink (or conductive ink) and a second ink (or transparent conductive ink), respectively, in the present specification. As described above, not only the ink K1 but also the ink K2 is printed on the substrate 10.

Figure 6D:
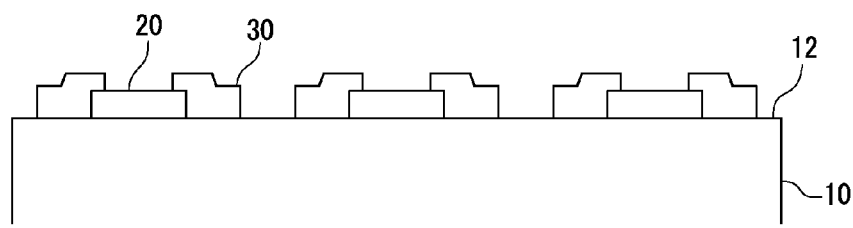

Thereafter, as shown in FIG. 6D, the first ink K1 and the second ink K2 are heated to bake the conductive material D1, thereby forming the electrode 20 and to bake the transparent conductive material D2, thereby forming the transparent conductive layer 30, respectively. The heating temperature may be 500° C. or higher and 850° C. or lower, for example. Where the transparent conductive layer 30 is made of ITO with a thickness of about 150 nm, its light transmittance is about 85%. As described above, a part of the electrode 20 is exposed through the transparent conductive layer 30 without being covered. Accordingly, even when the solvent and the binder are gasified at heating, the transparent conductive layer 30 can be formed without involving formation of a crack in the transparent conductive layer 30.

Figure 7:
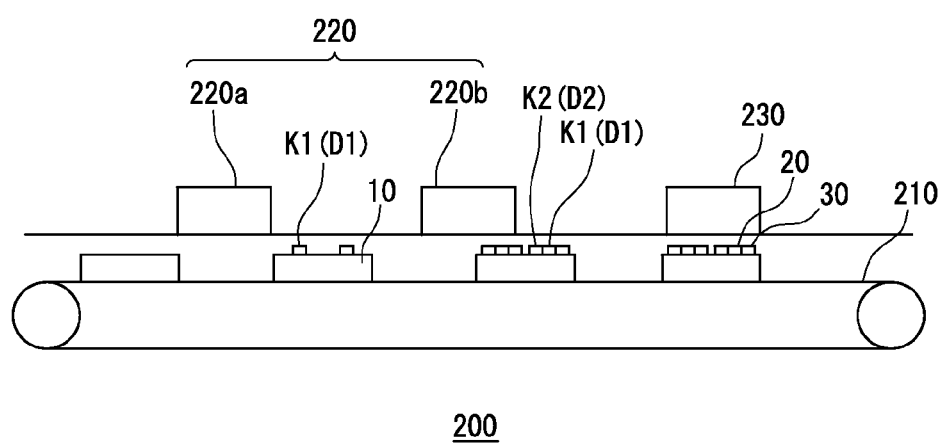
FIG. 7 is a schematic illustration of a printing apparatus according to Embodiment 1 of the present invention.

It is noted that the manufacturing method described with reference to FIG. 6 is suitably performed using the following printing apparatus. FIG. 7 is a schematic illustration of a printing apparatus according to Embodiment 1 of the present invention. A printing apparatus 200 in the present embodiment includes a conveyor 210 configured to convey the substrate 10, a printing section 220, and a heater 230. The printing section 220 includes a plurality of printers. Here, the printing section 220 includes a printer 220a configured to print the ink K1 containing the conductive material D1 and a printer 220b configured to print the ink K2 containing the transparent conductive material D2. It is noted that the printers 220a, 220b may be referred to as a first printer (or a conductive ink printer) and a second printer (or a transparent conductive ink printer), respectively, in the present specification.

First, the substrate 10 is placed on the conveyor 210 that is rotating, and the conveyor 210 conveys the substrate 10. When the substrate 10 conveyed by the conveyor 210 reaches below the first printer 220a, the printer 220a prints the ink K1 on the substrate 10.

Next, when the substrate 10 conveyed by the conveyor 210 reaches below the second printer 220b, the printer 220b prints the ink K2 on the substrate 10. It is noted that the conveyance speed of the conveyor 210 and printing of the printers 220a, 220b are set so that the ink K2 is arranged at the predetermined position relative to the ink K1.

Then, the conveyor 210 conveys the substrate 10, on which the ink K1 and the ink K2 are layered, to the heater 230. The heater 230 heats the substrate 10 to bake the ink K1 and the ink K2. Accordingly, the K1 is formed into the electrode 20 containing the conductive material D1, while the ink K2 is formed into the transparent conductive layer 30 containing the conductive material D2. Thus, the panel 100 is manufactured.

Figure 8:
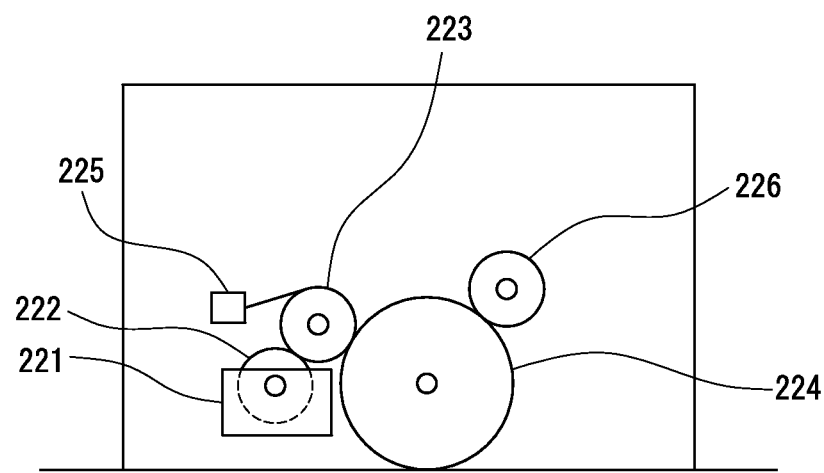
FIG. 8 is a schematic illustration of a printer of the printing apparatus according to Embodiment 1 of the present invention.

FIG. 8 is a schematic illustration of the printer 220a. The printer 220a includes an ink tray 221, an ink supply roll 222, an intaglio printing roll 223, a transfer roll 224, a scraper 225, and a cleaning roller 226. The intaglio printing roll 223 may be called a printing plate also, while the transfer roll 224 may be called a blanket also. Each of the ink supply roll 222, the intaglio printing roll 223, and the transfer roll 224 is mounted rotatably.

For example, the transfer roll 224 rotates accompanied by rotation of the intaglio printing roll 223. The surface of the intaglio printing roll 223 is subjected to metal plating. The transfer roll 224 is made of a rubber-based material. Accordingly, their friction coefficients are comparatively low. Although the diameters of the intaglio printing roll 223 and the transfer roll 224 are different from each other herein, the diameters of the intaglio printing roll 223 and the transfer roll 224 may be almost equal to each other.

In the printer 220a, the ink K1 in the ink tray 221 moves from the ink supply roll 222 to the peripheral surface of the intaglio printing roll 223, moves further to the peripheral surface of the transfer roll 224, and is then transferred to the surface of the substrate 10, which sequentially passes below the transfer roll 224. Such printing may be called offset printing also.

Description will be made in detail below. The ink K1 to be printed on the substrate 10 is retained in the ink tray 221. When the ink K1 in the ink tray 221 decreases, the ink K1 is supplemented to the ink tray 221 from a pump (not shown) below. The ink tray 221 is arranged near below the printer 220a.

The lower part of the ink supply roll 222 is dipped in the ink K1 in the ink tray 221. The ink supply roll 222 rotates while being dipped in the ink K1 in the ink tray 221. The ink K1 adhering to the ink supply roll 222 moves to the intaglio printing roll 223. It is noted that the scraper 225 is provided in the vicinity of the intaglio printing roll 223. Before the intaglio printing roll 223 comes in contact with the transfer roll 224 after getting out from the ink K1 in the ink tray 221, the scraper 225 removes surplus ink K1 adhering to the intaglio printing roll 223.

Recesses are formed in the surface of the intaglio printing roll 223. The recesses correspond to lines, figures, patterns, etc. to be printed on the substrate 10. For example, the intaglio printing roll 223 may have an outer diameter of 100 mm and a width of 145 mm.

The ink K1 adhering to the recesses in the intaglio printing roll 223 adheres to the transfer roll 224. The transfer roll 224 rotates while coming in contact with the peripheral surface of the intaglio printing roll 223 and presses the surface of the substrate 10 passing therebelow, thereby transferring the ink K1 to the substrate 10. The transfer roll 224 is made of a material having excellent releasability so that the ink K1 can be transferred smoothly and definitely from the transfer roll 224 to the surface of the substrate 10.

For example, the transfer roll 224 may be made of a type of silicon rubber. The transfer roll 224 has an outer diameter of 200 mm and a width of 135 mm. The ink K1 is formed correspondingly to the recesses in the intaglio printing roll 223. For example, in order to form a printing layer Eb with a width of 30 μm, the width of the corresponding recesses in the intaglio printing roll 223 is 30 μm. The cleaning roller 226 is provided in the vicinity of the transfer roll 224. The cleaning roller 226 removes surplus ink K1 adhering to the transfer roll 224.

It is noted that the printer 220b has a configuration similar to that of the printer 220a described with reference to FIG. 8. Specifically, the printer 220b has a configuration similar to that of the aforementioned printer 220a, except that ink in an ink tray 221 and recesses in an intaglio printing roll 223 are different from those in the printer 220a. Ink K2 is retained in the tray 221 in the printer 220b. The ink K2 herein contains ITO in particulate form and a vehicle. The vehicle contains resin and a solvent. The vehicle of the ink K2 may be the same as that of the ink K1. Or, the vehicle of the ink K2 may be similar to that of the ink K1. As described above, the printing apparatus 200 prints the ink K1 and the ink K2 by offset printing. By offset printing, each width of the ink K1 and the ink K2 can be reduced. As a result, the electrode 20 and the transparent conductive layer 30 with small widths can be formed.

Figure 9:
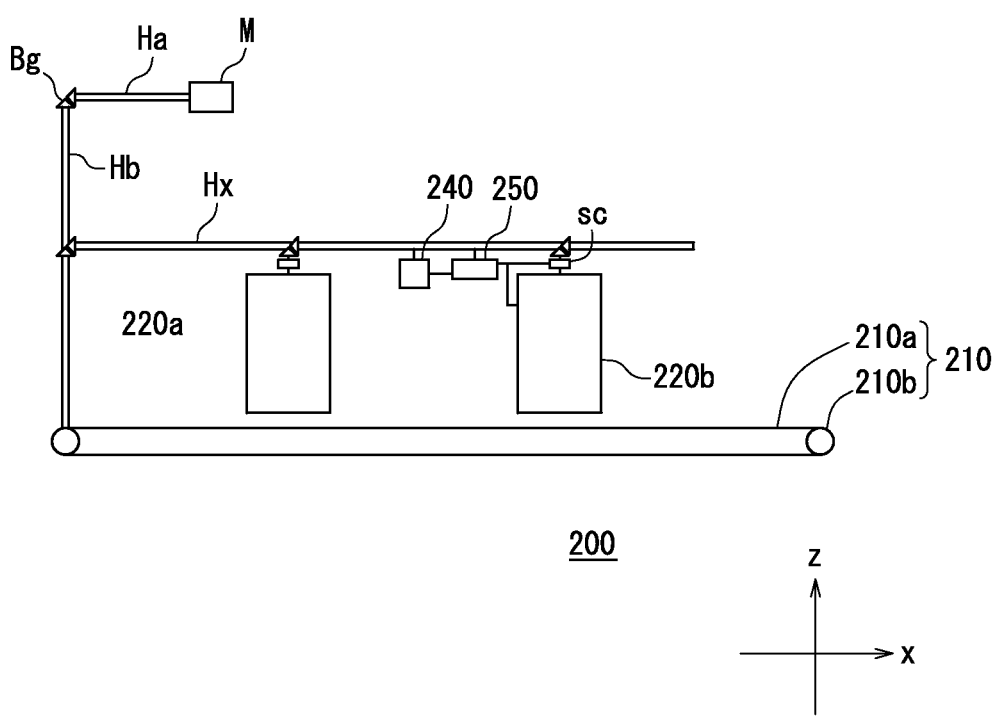
FIG. 9 is a schematic illustration of one example of the printing apparatus shown in FIG. 7.

One example of the printing apparatus 200 will be described below with reference to FIG. 9. The conveyor 210 includes a toothed belt 210a and a sprocket 210b. The toothed belt 210a may be called a cogged belt also. It is noted that in order to manufacture a solar panel, the lengths in the x direction and the y direction of the conveyor 210 are set to be, for example, 5 m and 1 m, respectively.

A single motor M performs printing and conveyance herein. A shaft Ha is connected to the motor M so that the rotation of the motor M is transmitted to the shaft Ha. The shaft Ha is connected to a shaft Hb through a rotational direction changing section Bg. The shaft Hb is connected to a shaft Hx through the rotational direction changing section Bg. Accordingly, the shafts Ha, Hb, Hx are rotated accompanied by the rotation of the motor M. The shaft Hb may be called an idler shaft also. The shaft Hx may be called a conveyor shaft also. The rotational direction changing section Bg may be a bevel gear, for example.

Though not shown herein, the printers 220a, 220b are suspended from LM guides. Further, as described with reference to FIG. 8, the intaglio printing roll 223 and the transfer roll 224 of each printer 220a, 220b rotate together with a shaft Hx connected through the bevel gear Bg. Accordingly, printing and conveyance of the printing apparatus 200 are synchronous with each other. Further, the sprocket of the conveyor 210 rotates together with the shaft Hb.

For example, when the ratio of the diameter of the sprocket to the diameter of the intaglio printing roll 223 is set to be an integer, conveyance of the substrate and printing can be easily made synchronous with each other. For example, the ratio of the diameter of the sprocket to the diameter of the intaglio printing roll 223 may be 2:1. Alternatively, the ratio may be 1:1. It is noted that printing and the conveyance are made synchronous with each other mechanically in the printing apparatus 200 shown in FIG. 9, which however, should not be taken to limit the present invention. A servo system may be employed for synchronization between printing and conveyance.

It is noted that the intaglio printing roll 223 of the printer 220a corresponds to both the bus bar electrodes 22 and the finger electrodes 24, and the printing section 220a prints at one time the ink K1 corresponding to the electrode 20 including the bus bar electrodes 22 and the finger electrodes 24 in the above description, which however, should not be taken to limit the present invention. The electrode 20 may be printed by two printers. For example, one of the printers may form one of the bus bar electrodes 22 and the finger electrodes 24 first, and then, the other printer forms the other electrode subsequently. For example, the intaglio printing roll 223 of one of the printers corresponds to the finger electrodes 24. After this printer may print ink corresponding to the finger electrodes 24, the other printer may print ink corresponding to the bus bar electrodes 22.

It is noted that in the above description with reference to FIGS. 3 and 4, each finger electrodes 24 includes the contact region 24a in contact with the transparent conductive layer 30 and the non-contact region 24b out of contact with the transparent conductive layer 30, which however, should not be taken to limit the present invention. Each bus bar electrode 22 may include a contact region in contact with the transparent conductive layer 30 and a non-contact region out of contact with the transparent conductive layer 30.

Figure 10:
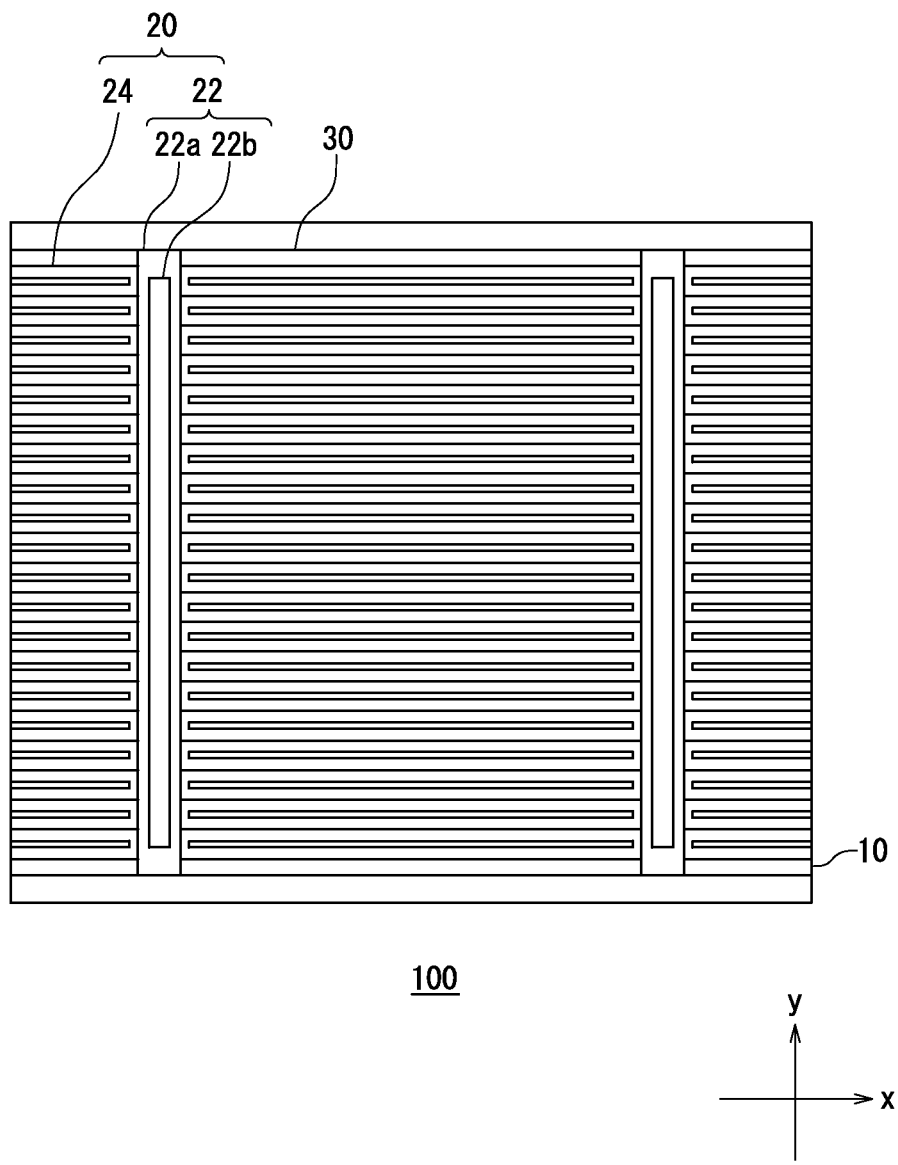
FIG. 10 is a tope view of the panel according to Embodiment 1 of the present invention.

FIG. 10 is a schematic tope view showing one example of the panel 100. Here, the transparent conductive layer 30 is arranged along each side of the bus bar electrodes 22. Each bus bar electrode 22 includes a contact region 22a in contact with the transparent conductive layer 30 and a non-contact region 22b out of contact with the transparent conductive layer 30. A part of each bus bar electrode 22 is exposed through the transparent conductive layer 30. It is noted that each of the bus bar electrodes 22 and the finger electrodes 24 may include the contact regions 22a, 24a and the non-contact regions 22b, 24b, of course.

Figure 11A:
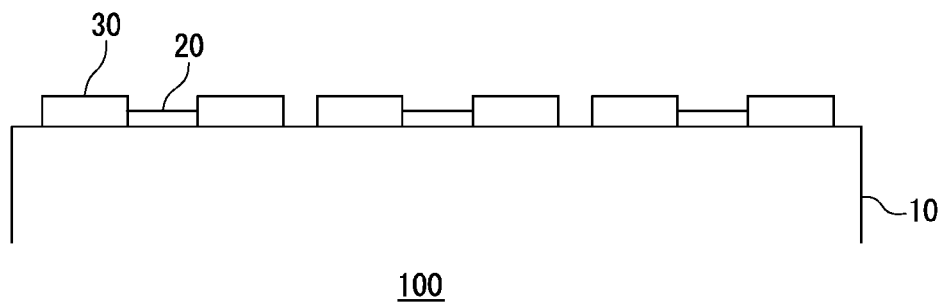
FIGS. 11A and 11B are schematic cross sectional views of the panel according to Embodiment 1 of the present invention.
Figure 11B:
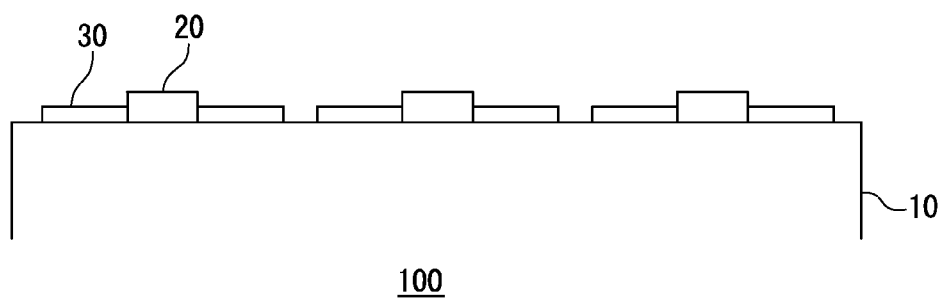

It is noted that the electrode 20 has a single-layer structure in the above description, which however, should not be taken to limit the present invention. The electrode 20 may have a layered structure of two or more layers, and the printing section 220 may include three or more printers. Further, the transparent conductive layer 30 is higher than the electrode 20 and is partially overlain on the electrode 20 in the above description, although the present invention is not limited in this respect. As shown in FIG. 11A, the transparent conductive layer 30 may not be overlain on the electrode 20, and the transparent conductive layer 30 is higher than the electrode 20. Further, the transparent conductive layer 30 is higher than the electrode 20 in the above description, although the present invention is not limited in this respect. As shown in FIG. 11B, the transparent conductive layer 30 may be lower than the electrode 20.

It is noted that in the above description with reference to FIG. 6, the ink K2 containing the transparent conductive material D2 is printed after the ink K1 containing the conductive material D1 is printed, although the present invention is not limited in this respect. The ink K1 containing the conductive material D1 may be printed after the ink K2 containing the transparent conductive material D2 is printed.

With reference to FIG. 12, description will be made below about a printing method and a panel manufacturing method including the printing method according to Embodiment 1 of the present invention. It is noted that the panel 100 shown in FIG. 11A is manufactured herein as one example.

Figure 12A:
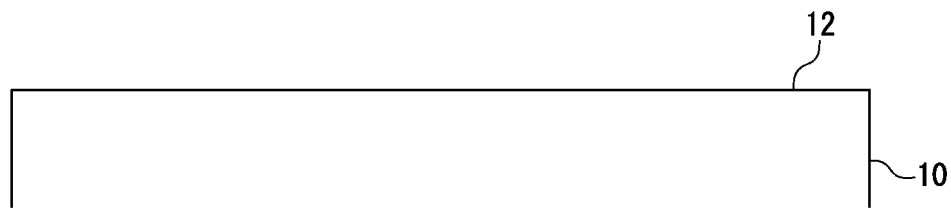
FIGS. 12A-12D are schematic illustrations for explaining a panel manufacturing method according to Embodiment 1 of the present invention.
Figure 12B:
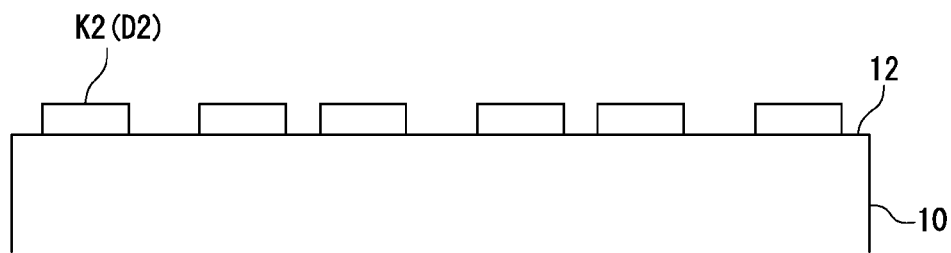

First, as shown in FIG. 12A, the substrate 10 having the obverse surface 12 is prepared. As described above, the substrate 1 may be a silicon substrate, for example. Next, as shown in FIG. 12B, the ink K2 containing the transparent conductive material D2 is printed. The conductive material D2 may be a single substance or a mixture of indium tin oxide (ITO), fluorine doped tin oxide (FTO), aluminum zinc oxide (AZO), or antimony tin oxide (ATO).

Figure 12C:
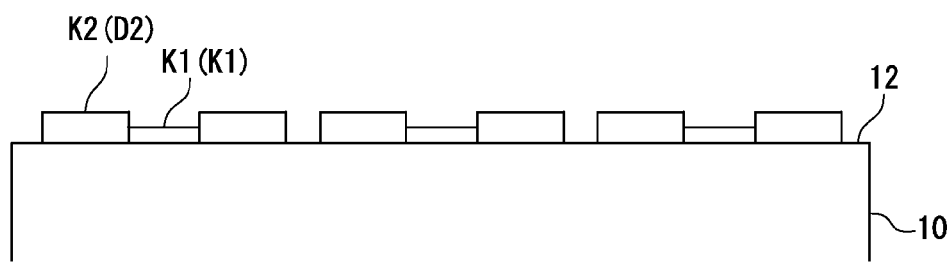
Figure 12D:
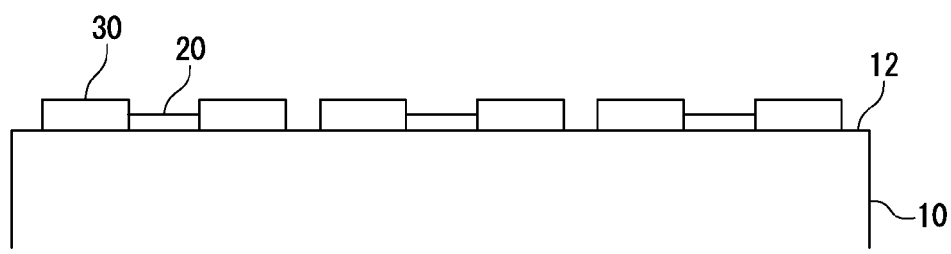

Subsequently, as shown in FIG. 12C, the ink K1 containing the conductive material D1 is printed. The conductive material D1 may be a single substance or a mixture of silver, copper, gold, carbon, cobalt, titanium, nickel, aluminum, etc. Thereafter, as shown in FIG. 12D, the ink K and the ink K2 are heated to bake the conductive material D1, thereby forming the electrode 20 and to bake the transparent conductive material D2, thereby forming the transparent conductive layer 30, respectively. The heating temperature may be 500° C. or higher and 850° C. or lower, for example. As described above, since a part of the electrode 20 is exposed without being covered with the transparent conductive layer 30, even when the solvent and the binder are gasified at heating, the transparent conductive layer 30 can be formed without involving formation of a crack in the transparent conductive layer 30.

Figure 13A:
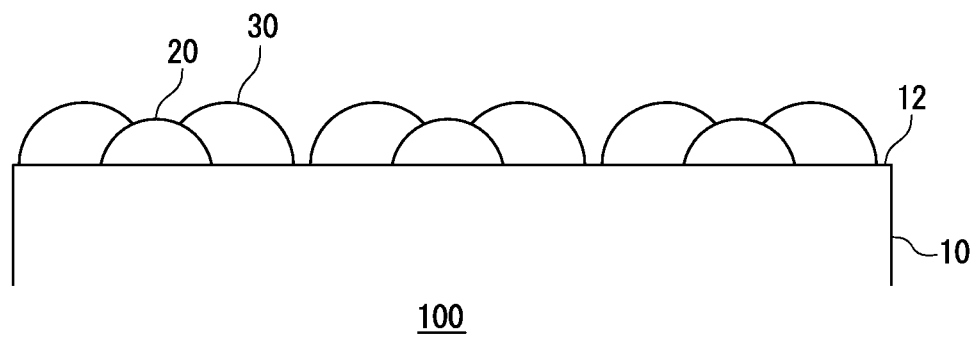
FIGS. 13A and 13B are schematic cross sectional views of the panel according to Embodiment 1 of the present invention.
Figure 13B:
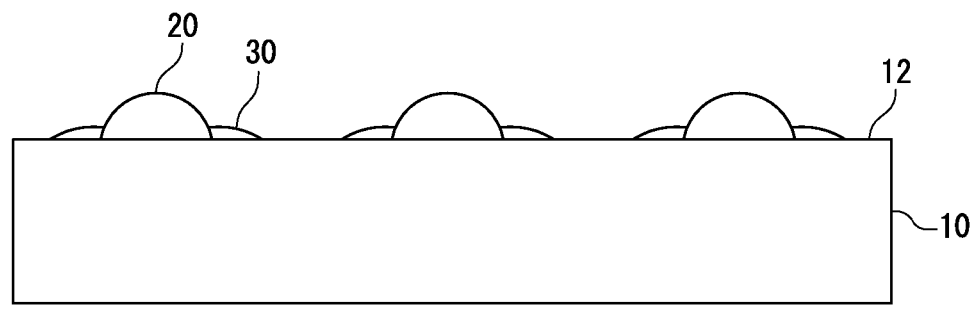

It is noted that the electrode 20 has a rectangular shape in cross section in FIGS. 1, 2, 4, 5, and 6, and each of the electrode 20 and the transparent conductive layer 30 has a rectangular shape in cross section in FIG. 11, which are mere examples. For example, as shown in FIG. 13A, each cross section of the electrode 20 and the transparent conductive layer 30 may be curved due to influence of the surface tension or the like. Further, in this case, the transparent conductive layer 30 may be lower than the electrode 20, as shown in FIG. 13B.

It is noted that the electrode 20 is printed by the printing section 220a in the above description, although the present invention is not limited in this respect. The electrode 20 may be formed by another method. When the electrode 20 is formed by offset printing, the electrode 20 can have a width of about 2 μm to 10 μm, for example. Further, the transparent conductive layer 30 is printed by the printing section 220b in the above description, although the present invention is not limited in this respect. The transparent conductive layer 30 may be formed by another method. For example, the panel 100 may be manufactured by etching. With reference to FIG. 14, a method for suitably manufacturing the panel 100 will be described below.

Figure 14A:
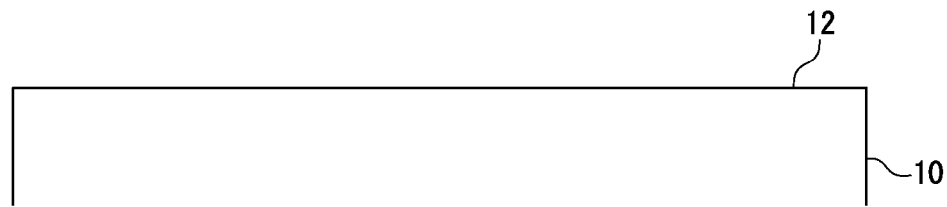
FIGS. 14A-14D are schematic illustrations for explaining a panel manufacturing method according to Embodiment 1 of the present invention.
Figure 14B:
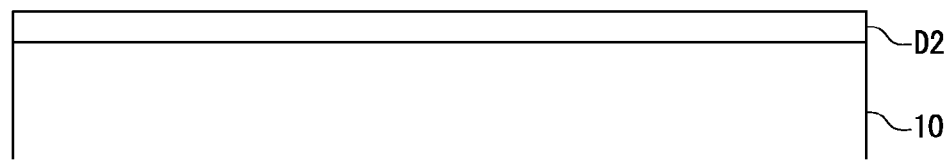

First, as shown in FIG. 14A, the substrate 10 having the obverse surface 12 is prepared. As described above, the substrate 10 may be a silicon substrate, for example. Next, as shown in FIG. 14B, the transparent conductive layer D2 is formed on the obverse surface 12. As described above, the conductive material D2 contains a transparent conductive material. For examples, the transparent conductive layer D2 is formed by deposition. The conductive material D2 may be a single substance or a mixture of indium tin oxide (ITO), fluorine doped tin oxide (FTO), aluminum zinc oxide (AZO), or antimony tin oxide (ATO).

Figure 14C:
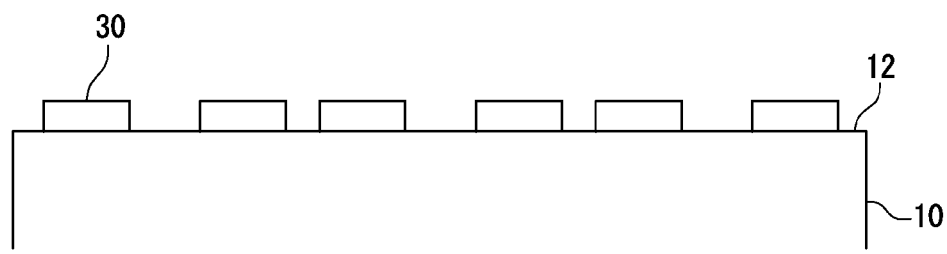
Figure 14D:
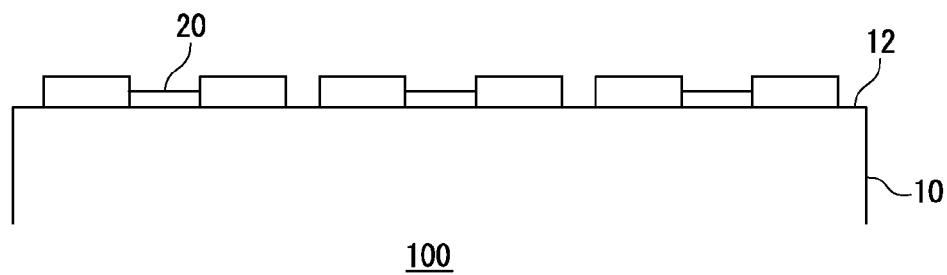

Subsequently, as shown in FIG. 14C, the transparent conductive layer D2 is subjected to photolithography to remove part of the transparent conductive layer D2. Further, the transparent conductive layer D2 is heated to form the transparent conductive layer 30. For example, the heating temperature may be 500° C. or higher and 850° C. or lower. Next, as shown in FIG. 14D, the ink K1 containing the conductive material D1 is allowed to flow into a region from which the transparent conductive layer D2 is removed to form the electrode 20. The ink K1 may be the same as the aforementioned ink K1 in the above description about the printing method. The conductive material D1 may be a single substance or a mixture of silver, copper, gold, carbon, cobalt, titanium, nickel, aluminum, etc. The electrode 20 is formed by heating the ink K1 allowed to flow therein. As such, the panel 100 may be manufactured by etching. In this case, the electrode 20 with a width of about 0.2 µm to 1 µm can be formed. Alternatively, the panel 100 can be manufactured by ink jetting. In this case, the electrode 20 with a width of about 5 µm can be formed.

Further, the electrode 20 includes the contact region 20a in contact with the transparent conductive layer 30 and the non-contact region 20b out of contact with the transparent conductive layer 30 in the above description, although the present invention is not limited in this respect. The electrode 20 may not include the non-contact region 20b.

Figure 15:
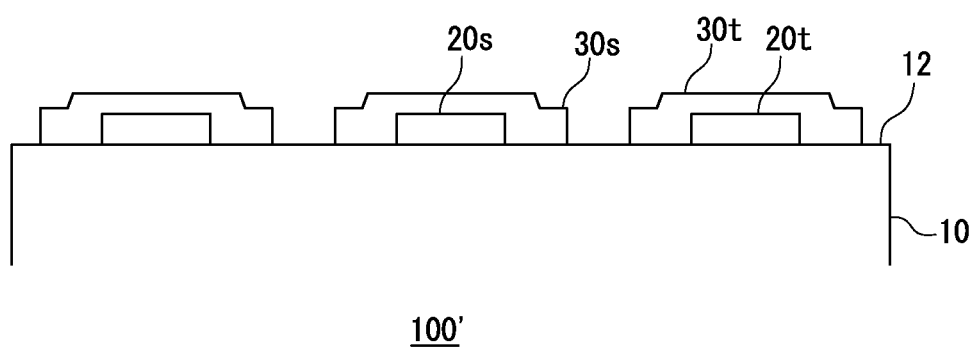
FIG. 15 is a schematic cross sectional view of the panel according to Embodiment 1 of the present invention.

For example, as in a panel 100' shown in FIG. 15, the electrode 20 may be covered with the transparent conductive layer 30. The electrode 20 includes electrode portions extending in parallel to each other. In FIG. 15, two electrode portions extending in parallel to each other are denoted as electrode portions 20s, 20t. It is noted that the electrode portions 20s, 20t may be electrically connected together at their other parts to have almost equal potential.

For example, when assuming that the electrode portions 20s, 20t extend in the x direction orthogonal to the y direction and the z direction, the transparent conductive layer 30 is separated into one side (on the side in the positive y direction) and the other side (on the side in the negative y direction) of each electrode portion 20s, 20t extending in the predetermined direction (the x direction). Of the transparent conductive layer 30, a part 30s located along the side of the electrode portion 20s at the side of the electrode portion 20t and a part 30t located along the electrode portion 20t at the side of the electrode portion 20s are separated from each other. This can save on the used amount of a transparent conductive material, which is comparatively expensive.

Embodiment 2

The electrode 20 has a single-layer structure in the above description, which however, should not be taken to limit the present invention. A panel according to Embodiment 2 of the present invention will be described below. A panel 100A according to the present embodiment has a configuration similar to that of the aforementioned panel 100, except that an electrode 20 has a layered structure made of different conductive materials. For the sake of avoiding redundant description, duplicate description is omitted.

Figure 16:
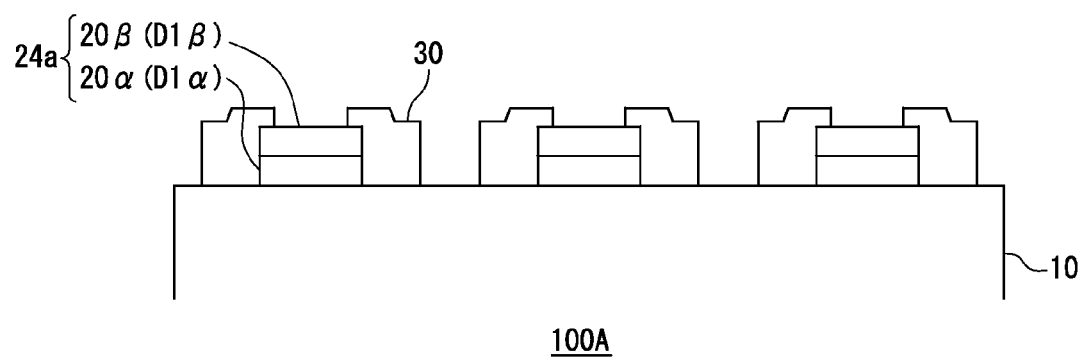
FIG. 16 is a schematic cross sectional view of a panel according to Embodiment 2 of the present invention.

FIG. 16 shows a cross section, in which the electrode 20 also extends in a given direction. The electrode 20 of the panel 100A has a layered structure. The electrode 20 herein has a two-layer structure and includes a conductive layer 20α in contact with the obverse surface 12 of the substrate 10 and a conductive layer 20β provided on the conductive layer 20α. The conductive layer 20α has almost the same width as the conductive layer 20β. The conductive layer 20α contains a conductive material D1α, while the conductive layer 20β contains a conductive material D1β different from the conductive material D1α. As described above, the conductive layer 20β extends in the same direction as the conductive layer 20α in at least a region.

The conductive material D1α may be a single substance or a mixture of, for example, silver, copper, gold, carbon, cobalt, titanium, nickel, aluminum, etc. Further, the conductive material D1β may be a single substance or a mixture of, for example, silver, copper, gold, carbon, cobalt, titanium, nickel, aluminum, etc., which is different from the conductive material D1α. It is noted that the conductive materials D1α, D1β are required only not to be completely the same.

In the case where either the conductive materials D1α or D1β is a mixture, one conductive material of the mixture may be or may not be contained in the other conductive material. Further, in the case where both the conductive materials D1α, D1β are mixtures, a conductive material in one of the conductive materials may be or may not be contained in the other conductive material. Preferably, the conductive material D1α may be silver, while the conductive material D1β may be any of copper, gold, carbon, cobalt, titanium, nickel, and aluminum, or a mixture containing at least two selected from the group consisting of silver, copper, gold, carbon, cobalt, titanium, nickel, and aluminum.

For example, the conductive material D1α may be silver, while the conductive material D1β may be copper. It is noted that the conductive material D1α is suitably selected according to a material for forming the obverse surface 12 of the substrate 10. For example, in the case where the obverse surface 12 is made of silicon, the use of silver as the conductive material D1α can reduce the contact resistance. Typically, metal materials having low resistivity are used as the conductive materials D1α, D1β. The width of the conductive layer 20α is almost equal to the width of the conductive layer 20β.

As such, the electrode 20 having a layered structure can increase the sectional area even with a comparatively narrow width, thereby achieving low resistivity. Further, since the conductive layer 20β contains the conductive material D1β different from the conductive material D1α of the conductive layer 20α, the conductive material D1β of the conductive layer 20β can be selected without involving substantial influence of the obverse surface 12 of the substrate 10, thereby increasing the degree of freedom of design for the electrode 20. Moreover, the conductive layer 20α containing silver and the conductive layer 20β containing copper are layered in the panel 100. Thus, the resistance of the electrode 20 itself can be reduced, while the use amount of expensive silver can be reduced.

With reference to FIG. 17, a method for suitably manufacturing the panel 100A will be described below. First, as shown in FIG. 17A, the substrate 10 having the obverse surface 12 is prepared. As described above, the substrate 10 may be a silicon substrate, for example. Subsequently, ink K1α containing the conductive material D1α is printed on the substrate 10. For example, the ink K1α contains the conductive material D1α in particulate form and a vehicle. The vehicle contains resin and a solvent. The conductive material D1α may be a single substance or a mixture of silver, copper, gold, carbon, cobalt, titanium, nickel, aluminum, etc.

Figure 17A:
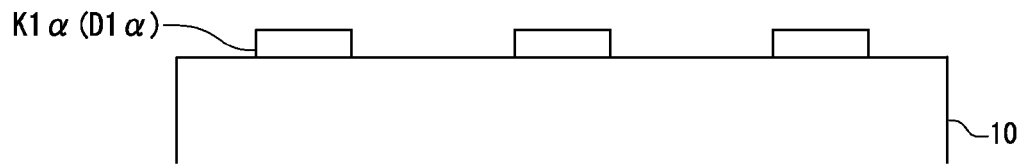
FIGS. 17A-17D are schematic illustrations for explaining a panel manufacturing method according to Embodiment 2 of the present invention.
Figure 17B:
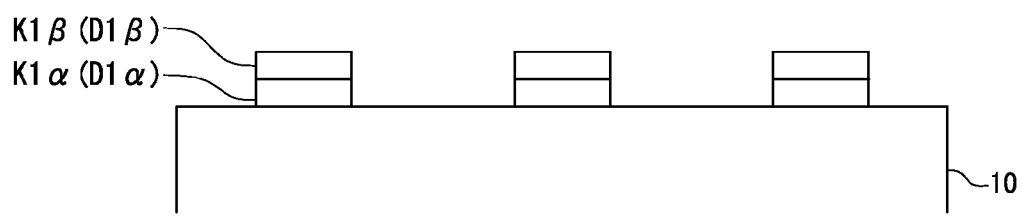

Next, as shown in FIG. 17B, the ink K1β containing the conductive material D1β different from the conductive material D1α is printed on the ink K1α. As described above, the conductive material D1β may be a single substance or a mixture of silver, copper, gold, carbon, cobalt, titanium, nickel, aluminum, etc., which is different from the conductive material D1α. For example, the ink K1β contains the conductive material D1β in particulate form and a vehicle.

Figure 17C:
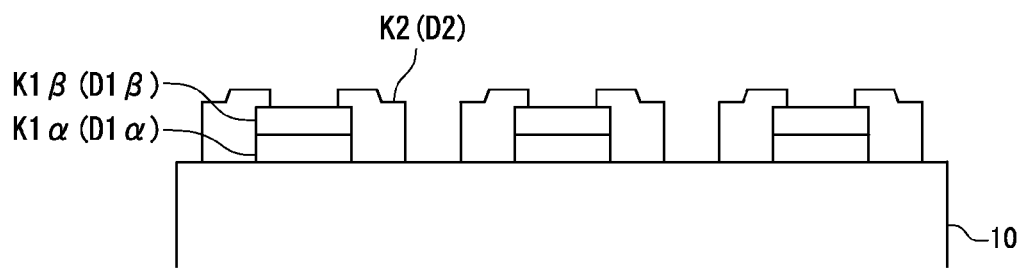

Subsequently, as shown in FIG. 17C, the ink K2 containing the transparent conductive material D2 is printed so as to be in contact with the ink K1α and the ink K1β. The transparent conductive material D2 is a material different from the conductive materials D1α, D1β. The transparent conductive material D2 may be a single substance or a mixture of indium tin oxide (ITO), fluorine doped tin oxide (FTO), aluminum zinc oxide (AZO), or antimony tin oxide (ATO).

Figure 17D:
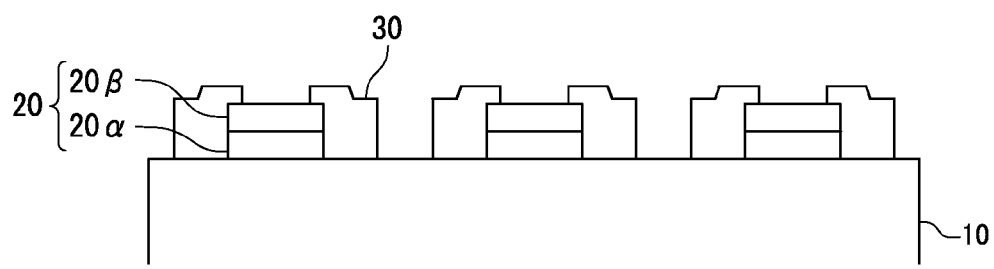

Thereafter, as shown in FIG. 17D, the ink K1α, the ink K1β, and the ink K2 are heated to bake the conductive material D1α, thereby forming the conductive layer 20α, to bake the conductive material D1β, thereby forming the conductive layer 20β, and to bake the transparent conductive material D2, thereby forming the transparent conductive layer 30, respectively. The heating temperature may be 500° C. or higher and 850° C. or lower, for example.

Figure 18:
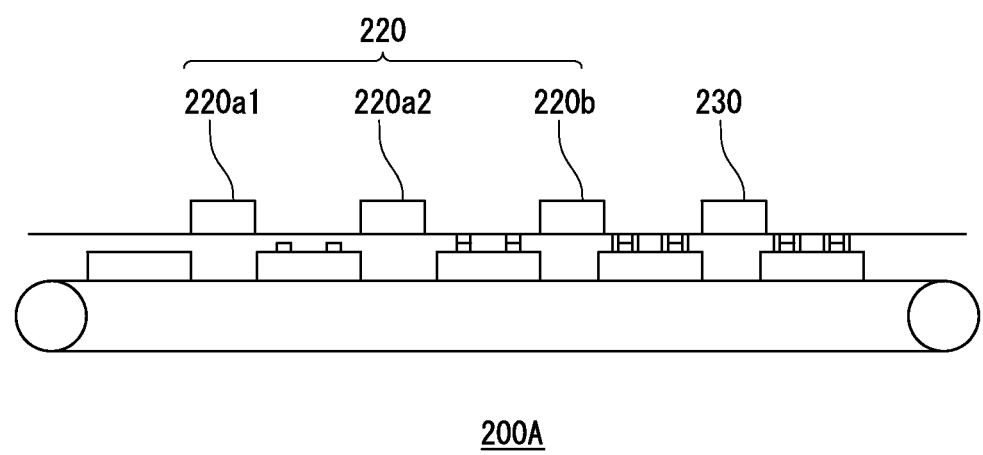
FIG. 18 is a schematic illustration of a printing apparatus according to Embodiment 2 of the present invention.

The manufacturing method and the printing method described with reference to FIG. 17 are suitably performed using the following printing apparatus. FIG. 18 shows a printing apparatus according to Embodiment 2 of the present invention. A printing apparatus 200A according to the present embodiment includes a conveyor 210 configured to convey a substrate 10, a printing section 220, and a heater 230. The printing section 220 includes a plurality of printers. The printing section 220 herein includes a printer 220a1 configured to print the ink K1α containing the conductive material D1α, a printer 220a2 configured to print the ink K1β containing the conductive material D1β different from the conductive material D1α, and a printer 220b configured to print the ink K2 containing the transparent conductive material D2.

First, the substrate 10 is placed on the conveyor 210 that is rotating, and the conveyor 210 conveys the substrate 10. When the substrate 10 conveyed by the conveyor 210 reaches below the printer 220a1, the printer 220a1 prints the ink K1α on the substrate 10. Next, when the substrate 10 conveyed by the conveyor 210 reaches below the printer 220a2, the printer 220a2 prints the ink K1β on the substrate 10. It is noted that the conveyance speed of the conveyor 210 and printing of the printers 220a1, 220a2 are set so that the ink K1β is overlain on the ink K1α.

Subsequently, when the substrate 10 conveyed by the conveyor 210 reaches below the printer 220b, the printer 220b prints the ink K2 on the substrate 10. It is noted that the conveyance speed of the conveyor 210 and printing of the printers 220a1, 220a2, 220b are set so that the ink K2 is in contact with at least the ink K1α.

Thereafter, the conveyor 210 conveys the substrate 10, on which the ink K1α, the ink K1β, and the ink K2 are layered, to the heater 230. The heater 230 heats the substrate 10, thereby baking the ink K1α, K1α, K2. This forms the conductive layer 20α containing the conductive material D1α, the conductive layer 20β containing the conductive material D1β, and the transparent conductive layer 30 containing the transparent conductive material D2. Thus, the electrode 20 including the conductive layers 20α, 20β containing different conductive materials is formed.

It is noted that in the above description, the electrode 20 has a two-layer structure, and the printing apparatus 200 includes the two printers 220a1, 220a2 for formation of the electrode 20, which however, should not be taken to limit the present invention. The electrode 20 may have a layered structure of three or more layers, and the printing section 220 may include three or more printers for formation of the electrode 20.

It is noted that the photoelectric conversion layer of the substrate 10 in each panel 100, 100', 100A contains silicon in the above description, which however, should not be taken to limit the present invention. The photoelectric conversion layer may contain an inorganic compound material. The photoelectric conversion layer may contain InGaAs, GaAs, a chalcopyrite-based material, $Cu_2ZnSnS_4$, and CdTe—CdS. Alternatively, the photoelectric conversion layer may contain an organic compound. It is noted that in the case where any of the panels 100, 100', 100A are employed as a solar panel, a plurality of panels 100, 100' or 100A are arranged in group.

Figure 19:
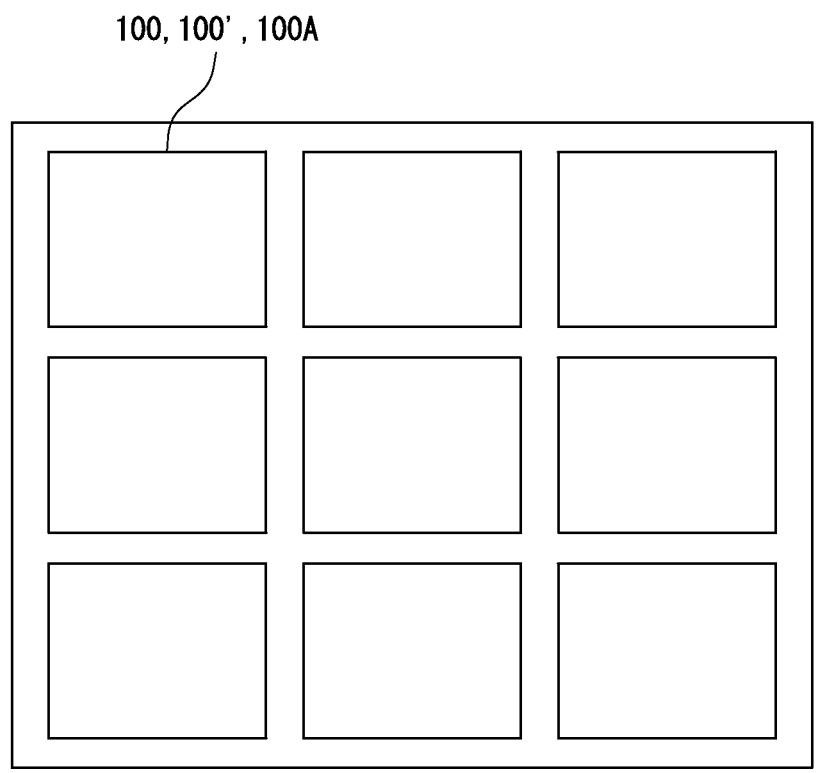
FIG. 19 is a schematic illustration of a solar cell module including a plurality of panels according to one embodiment of the present invention.

FIG. 19 shows a solar cell module 300 in which panels 100, 100', or 100A are arranged. In the solar cell module 300, the panels 100, 100', or 100A are arranged in matrix of a plurality of rows and a plurality of columns. The panels 100, 100', or 100A are connected together in series or in parallel.

It is noted that the panels 100, 100', or 100A is a solar panel in the above description, which however, should not be taken to limit the present invention. The panels 100, 100', 100A may be touch panels, or electro-magnetic field shield panels. Alternatively, the panels 100, 100', 100A may be employed in an organic EL.

It is noted that the electrode 20 and the transparent conductive layer 30 are provided directly on the substrate 10 in the above description, which however, should not be taken to limit the present invention. The electrode 20 and the transparent conductive layer 30 are provided on the substrate 10 with another layer interposed.

The present invention can save on the cost of the panel. The present invention is suitably employable in solar cell panels, touch panels, electro-magnetic field shield panels, organic ELs, solar cell modules, etc.

What is claimed is:

1. A solar panel, comprising:
   a substrate having a flat surface;
   an electrode provided on the flat surface of the substrate and an entire bottom surface of the electrode being in contact with the flat surface of the substrate; and
   a transparent conductive layer provided on the flat surface of the substrate along a side of the electrode and being in contact with the substrate,
   wherein the electrode includes a top and a plurality of sides including a first side and a second side,
   the transparent conductive layer includes a part in direct physical contact with the first side and a part in direct physical contact with the second side,
   the top of the electrode includes a contact portion in direct physical contact with the transparent conductive layer and a non-contact portion which does not directly physically contact with the transparent conductive layer,
   the transparent conductive layer is separated into a plurality of transparent conductive portions, one of the transparent conductive portions being located on the first side of the electrode, another of the transparent conductive portions being located on the second side of the electrode,
   the electrode includes a first electrode portion extending in a predetermined direction and a second electrode portion arranged at a different location from the first electrode portion and extending in parallel to the first electrode portion,
   the transparent conductive layer includes a first transparent conductive portion arranged along a side of the first electrode portion at a side of the second electrode portion and a second transparent conductive portion arranged along a side of the second electrode portion at a side of the first electrode portion, and
   the first transparent conductive portion and the second transparent conductive portion are separate from each other with a region of the substrate exposed between the first portion and the second portion.

2. The solar panel of claim 1, wherein
a part of the electrode is exposed through the transparent conductive layer.

3. The solar panel of claim 1, wherein
the electrode has a height from an obverse surface of the substrate, which is lower than the transparent conductive layer.

4. The solar panel of claim 1, wherein
the electrode has a layered structure.

5. The solar panel of claim 4, wherein
the layered structure includes:
   a first conductive layer containing a first conductive material; and
   a second conductive layer containing a second conductive material different from the first conductive material.

6. A solar cell module, comprising
a plurality of solar panels, each of the solar panels being a solar panel according to claim 1.

7. The solar panel of claim 1, wherein
the electrode further includes a bottom, and
the transparent conductive layer is out of contact with the bottom of the electrode.

8. The solar panel of claim 1, wherein
the electrode includes a plurality of electrode portions parallel to one another,
the plurality of electrode portions include the first electrode portion and the second electrode portion, and
the second electrode portion is closest to the first electrode portion among the plurality of electrode portions.

9. The solar panel of claim 1, wherein
the electrode includes a first conductive layer and a second conductive layer on the first conductive layer.

10. The solar panel of claim 9, wherein
the second conductive layer has a width equal to that of the first conductive layer.

11. The solar panel of claim 9, wherein
the first conductive layer and the second conductive layer each have a rectangular shape in cross section.

* * * * *